Figure 1:
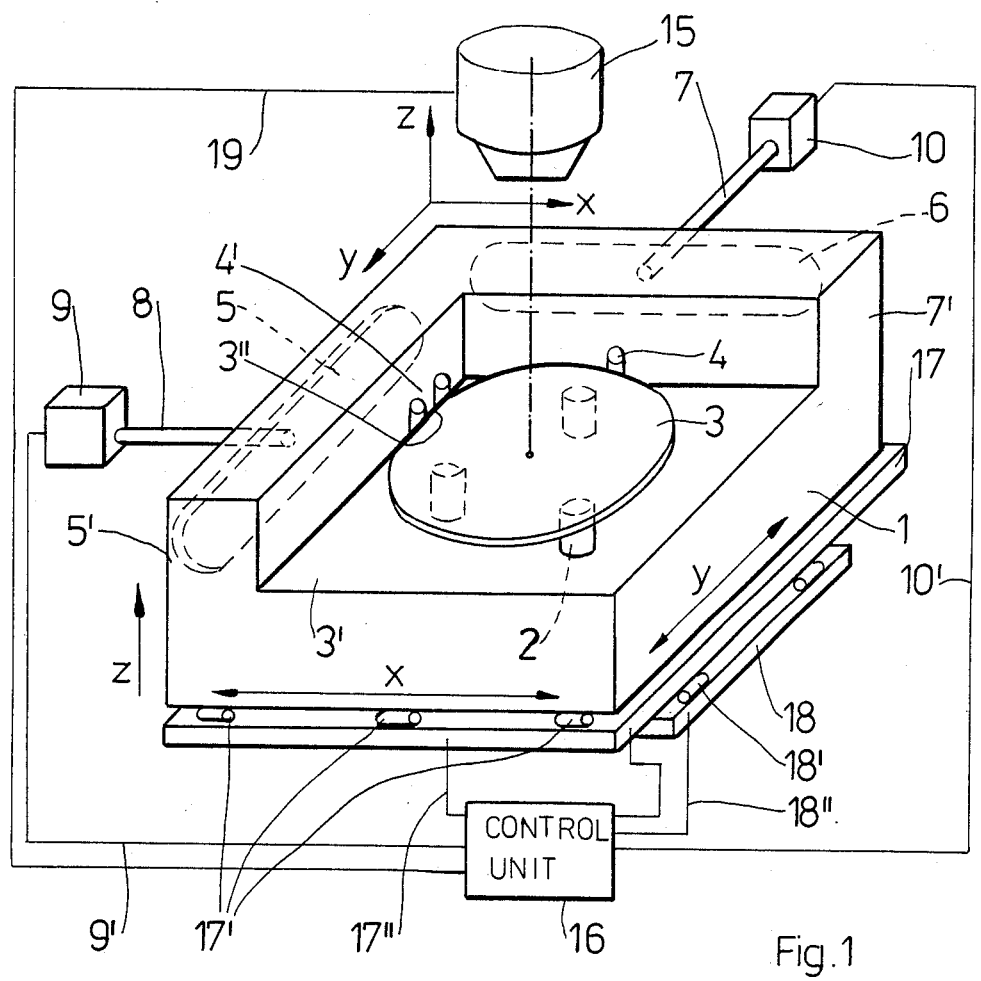

United States Patent [19]

Battig et al.

[11] Patent Number: 4,583,847
[45] Date of Patent: Apr. 22, 1986

[54] MOUNTING TABLE FOR WAFERS

[76] Inventors: Udo Battig, 41, Str.des 7.Oktober;
Peter Dittrich, Fr.-Körner-Strasse,
both of 6900 Jena, District of Gera;
Norbert Oertel, 39,
Otto-Grotewohl-Strasse, 6902
Jenna-Lobeda, District of Gera;
Günter Osterland,44, Fr.-Reuter-Str.,
6900 Jena, District of Gera; Mathias
Rücknagel, 106, Langenorla 6841,
District of Gera; Werner Scheler, 3,
Str.der Kosmonauten, 6900 Jena,
District of Gera; Klaus Schultz, 2,
Schlossberggasse, 6908 Jena-Burgau,
District of Gera, all of German
Democratic Rep.

[21] Appl. No.: 631,388

[22] Filed: Jul. 16, 1984

[30] Foreign Application Priority Data

Jul. 1, 1983 [DD] German Democratic Rep. .................................. 2526761

[51] Int. Cl.⁴ .............................................. G03B 27/42
[52] U.S. Cl. ...................................................... 355/53
[58] Field of Search ................................... 355/53, 54

[56] References Cited

U.S. PATENT DOCUMENTS 4,172,656 10/1979 Lacombat et al. .................... 355/53
4,239,381 12/1980 Lacombat et al. .................... 355/53
4,431,304 2/1984 Mayer ................................... 355/53
4,465,368 8/1984 Matsuura et al. ..................... 355/53

Primary Examiner—Monroe H. Hayes

[57] ABSTRACT

The invention relates to an improvement for a wafer mounting table particularly for use in photolithographic apparatus for processing wafers comprising a compact mounting block made of glass-ceramics which has two neighboring back supports limiting two sides of a top face of said mounting block. The top face is provided with at least three studs for supporting a wafer to be processed. The sides of the back-supports facing away from said top face are provided with an elongated horizontally extending silvered area each, which is in opposition to a laser path measuring system each. The laser beams of said laser path measuring system define a plane which coincides with a projection plane of a projection lens being provided in opposition to a wafer mounted on said studs. Means are provided for substantially eliminating departures of the silvered areas from a straight plane. Further means are provided which enable a quick adaption of the laser mount for wafer charges having different thicknesses or diameters.

9 Claims, 6 Drawing Figures

MOUNTING TABLE FOR WAFERS

The invention relates to an improvement in a mounting table particularly for use in photolithographic exposure apparatus for pattern production on semiconductor wafers which requires precision adjustment of the wafers relative to a projection lens.

The U.S. Pat. No. 3,786,332 discloses an arrangement for testing adjusting and processing of wafers. The arrangement includes a block provided with a wafer chuck which has lateral reflecting faces at right angles to one another. The measuring beams emitted by a laser path measuring system which is also mounted on said block are reflected upon said reflecting faces.

This arrangement is disadvantageous since the wafer surface and the plane defined by the measuring beams do not coincide so that tiltings and slant positions may cause first order errors in the measurement taken which, in turn, result in wrong positioning movements. Such wrong positionings increase the waste rate in semiconductor production.

Reason for the above disadvantage lies in the fact that Abbe's principle is not fulfilled. (Concerning Abbe's principle refer to "ABC der Optik" Brockhaus Verlag, Leipzig 1961, pg. 432). It is further known to use a wafer mount made of a single block having integral silvered L-shaped wings which satisfies the Abbe principle.

This wafer mount is disadvantageous since there are no means provided to ensure the high requirements for accuracy of the reflecting faces.

It is an object of the present invention to obviate the above disadvantages.

It is a further object of the present invention to provide a simple and yet effective means for precison positioning of a wafer relative to a pattern producing apparatus.

It is still a further object of the present invention to provide a compact and simple wafer mounting table incorporating two reflecting faces.

It is still a further object of the present invention to provide a means for eliminating technological inaccuracies in the reflecting faces of the wafer mounting table.

These and other objects are realised in a prismatic wafer mount for precision adjustment of a wafer to be processed relative to a pattern producing apparatus.

The prismatic wafer mount is provided at two adjacent sides with back supports which partially include a wafer supporting top face of the prismatic mount, said back supports areas facing away from the top face are provided each with a substantially horizontally extending silvered stripe being each in opposition to a laser path measuring system. Each of the latter emits a laser measuring beam directed upon the respective silvered portion for measuring the position of the prismatic mount and, hence, of a wafer mounted upon the top face of said prismatic mount. Preferably, the prismatic wafer mount is made from ceramics.

The laser path measuring systems are connected to an electronic compensation means for compensating deflections of the silvered portions from an ideal plane.

Furthermore, means are provided to displace the prismatic mount in a horizontal and/or vertical direction (x,y,z). Advantageously, the wafer supporting top face is provided with at least three studs having internal channels connected to a subpressure system, via one end portion. The other end portion of said studs is adapted for seating a wafer to be processed.

Furthermore at least one stop is provided adjacent each back support for attaining a defined arrest of the wafer to be processed, when moved upon the top face of the wafer mount.

It is a further advantage to provide spacer caps to be fitted upon the studs in the event of a change in thickness of a wafer charge to be processed.

The spacer caps are either provided with a bore hole in their top to hold a wafer disc or without a hole in the event that a smaller diameter wafer disc is inserted into the apparatus so that a suction stream is not required.

Figure 3:
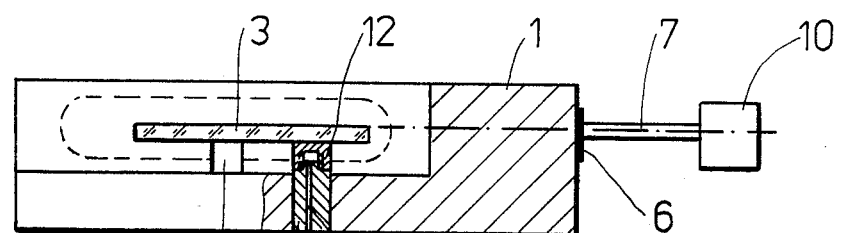
Figure 3A:
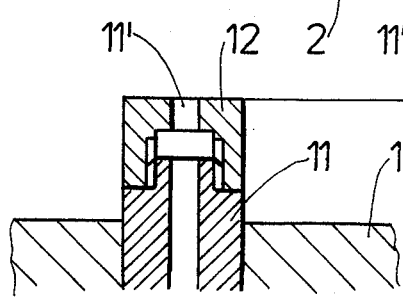
Figure 3B:
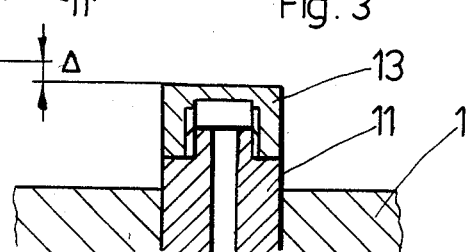
Figure 2:
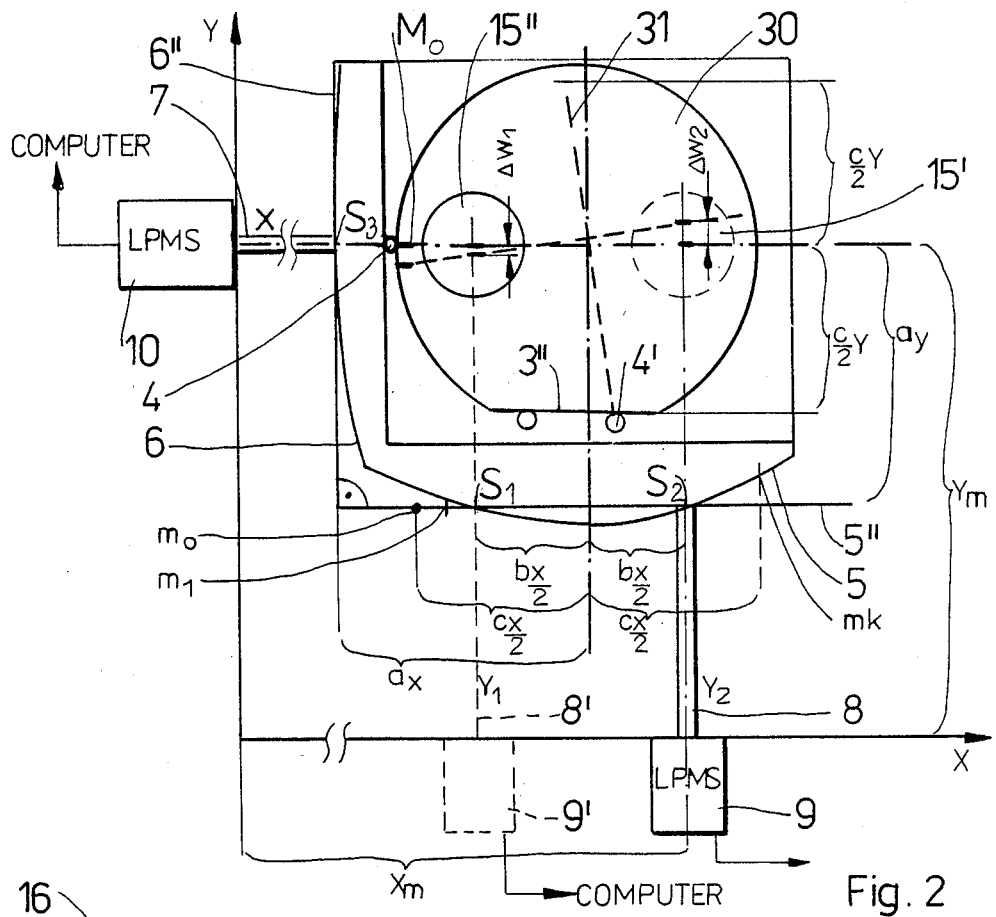
Figure 2A:
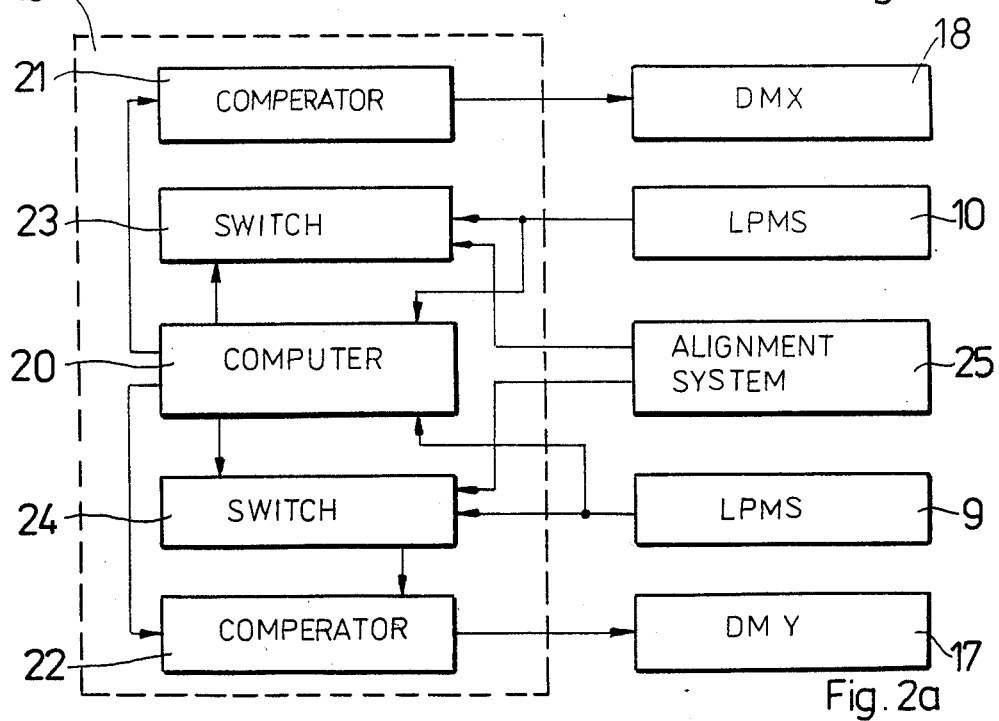

In order that the invention may be more readily understood reference is made to the accompanying drawings which illustrate diagrammatically and by way of example two embodiments thereof and where FIG. 1 is a perspective and schematic view of a wafer mount including a control unit, FIG. 2 a schematic top view of a normal for obtaining nominal values to balance departures from an ideal reflector plane of a mounting block, FIG. 2a a block scheme for control of the wafer mount of FIG. 1, FIG. 3 a schematical and sectional view of the wafer mount, FIGS. 3a, 3b two alternative solutions for seating a wafer disc on the wafer mount.

In FIG. 1 a prismatic wafer mount 1 for adjusting a wafer 3 in a projection plane (3) of a projection lens 15 consists of a prismatic block (1) and two back supports 5' and 7' at adjacent rear sides of said mount 1.

A top face 3' of the mount 1 is provided with three studs 2 for supporting the wafer 3 which abuts against stops 4 and 4' adjacent the back suppots 5' and 7', respectively. The stops 4 and 4' serve to define an end position for a transport of the wafer 3 upon the mount 1 by not shown means. The rear faces of the back supports 5' and 7' are provided with silvered elongated areas 5 and 6, respectively, which operate as reflectors and which are in opposition to laser path measuring device 9 and 10, respectively (LPM hereinafter). The latter emit laser measuring beams 8 and 7, respectively, directed upon the opposing reflectors 5 and 6, respectively. The wafer mount 1 is seated for displacements in x-direction on a cross-table constituted of a platform 18 and a platform 17 for displacement in y-direction.

The respective servo-motors and gear means are not visible as well as the piezo-elements for effecting z-displacements. The mount 1 moves on rollers 17' when displaced in y-direction and via the platform 17 and on rollers 18' when displaced in x-direction.

The respective servo-motors are connected via lines 17" (y-displacements) and 18" (x-displacements) to a control unit 16 which is also connected to the laser path measuring devices (LPM) 9 and 10 via a line 9' and 10', respectively, and to a not visible alignment system incorporated in the lens 15 via a line 19.

FIG. 2 shows a top view of the wafer mount 1 upon which a wafer normal 30 is seated for obtaining the straightness and flatness data of the reflectors 5 and 6. The wafer normal 30 has a reticle 31 on its top face which is slightly displaced relative to the x, y coordinate directions the displacement is indicated by the dashed line reticle. The number 15' designates the projection of the projection lens 15 upon the wafer normal 30. The wafer normal 30 has also a straight edge portion 3" which abuts against the stop 4' for preadjustment of the normal 30 on the mount 1.

The laser path measuring system 10 (LPM) emits a beam 7 which impinges upon the reflector 6 at a spot S3, for measuring an x-distance, and the laser path measuring system 9 emits a beam 8' which defines a spot S1 on the reflector 5 and a beam 8 (displaced position) which defines a spot S2 on the reflector 5. The distance between the plane of the reflector 5 and the spot S3 is $a_y$.

At the same time the "ideal" reticle 31 which is substantially in parallel to the x, y directions, respectively, has a distance $a_x$ between the y-arm and the plane of the reflector 6, and a distance $a_y$ between the plane 5 and the x-arm of the reticle 31.

The range of the supporting face 3' which lies within the operation scope of the projection lens 15 has edge lengths $c_x$, $c_y$ the reticle arms being defined by $c_x/2$ and $c_y/2$, respectively.

The spots S1/S2 are remote from the y-recticle arm by $b_x/2$ each.

A departure of the actual reticle (in dashed lines) from the "ideal" reticle 31 considered in the extension of the beam 8' (through spot S1) is $\Delta\omega_1$ and in the extension of beam 8 (through spot S2) is $\Delta\omega_2$.

Measuring points on the reflector plane 5 are $m_0$, $m_1$ ... $m_k$ which are the respective positions upon which the beam 8 impinges to measure the correction values indicative of an ideal reflector plane relative to the actual reflector plane 5 including the slight displacements of the wafer normal 30 on the mount 1.

The same is provided but not shown for the plane 6. In order to accurately position a wafer on the wafer mount 1, the arrangement of FIG. 2 serves to substantially eliminate any departures of the actual reflector planes 5, 6 from ideal flat and straight reflector planes (5", 6").

In operation, at first the "ideal" reflector planes 5", 6" are defined through the points S1, S2 and S3 the coordinates of which are stored in a computer 20 (FIG. 2a).

In a first step the departure of the wafer normal 30 from its nominal position is detected. To this end the wafer mount 1 is displaced via the displacement means 17, 18 (FIGS. 1 and 2a) until the first position S1 defined by $x_m + (b_x/2) - a_x$; $y_m - a_y$ is obtained. This is achieved in that the comparators 21, 22 are provided with the nominal values stored in the computer 20, and the former compare the nominal values to the actual values measured by the LPM 10. When a zero-balance is obtained, the displacement operation is stopped by a respective signal.

When the mount 1 is positioned accordingly the beam 8' impinges at S1 upon the reflector 5, whereas the projection lens field and its integral alignment system is shown at 15", where $\Delta\omega_1$ designates the departure of the "ideal" reticle 31 from the actual reticle. This departure is illustrated by two dashes at a narrow space from one another. Then the alignment system (not shown) is oriented to the actual reticle dash by displacement of the mount 1 by operation of the displacement means 17 (FIG. 1). To this end an alignment system 25 (FIG. 2a) is rendered operative by the switches 23, 24.

The resulting y-position is detected by the laser path measuring system 9 (dashed line position of 9') and fed into the computer 20.

The computer calculates the departure $\Delta\omega_1 = y - y_m + a_y$, where y is the actual position obtained.

In a next step the laser path measuring system 9 detects the point S2 by operation of the displacement means 18. The second position is characterised by $x_m - (b_x/2) - a_x / y_m - a_y$. The projection lens 15 defines a projection lens field 15' in which $\Delta\omega_2$ designates the departure of the "ideal" reticle 31 from the actual reticle. Again the departure is illustrated by two dashes.

The alignment system of the projection lens 15 is oriented to the actual reticle dash by displacement of the mount 1 by operation of the displacement means 17.

The resulting y-position is again detected by the laser path measuring system 9 and fed into the computer, which calculates the departure $\Delta\omega_2 = y - y_m + a_y$, where y is the actual position and $y_m + a_y$ the nominal position. From the $\Delta\omega_1$ and $\Delta\omega_2$ the computer calculates the actual position of the wafer normal 30 and in particular s (angular displacement) and $v_y$ (displacement of the origin in y-direction) hence, $$s = (\Delta\omega_2 - \Delta\omega_1)/2$$

and $$v_y = (\Delta\omega_1 + \Delta\omega_2)/2.$$

After having detected the displacements of the wafer normal 30 from an ideal or nominal position, and knowing these displacements (stored in the computer 20), the next operation is concerned with detecting correction values $\Delta_y$, $\Delta_x$ for the departures of the reflector planes 6 and 7, respectively, from an "ideal" flatness and/or straightness. To this end the reflector planes 5 and 6 are scanned at discrete intervals by the respective laser path measuring systems 9, 10. Since the procedure is the same for both planes 5, 6 only the operation for the reflector plane 5 is described hereinafter.

The mount 1 is displaced by the displacement means 17 so that the measuring beam 9 impinges upon the reflector plane 5' at $m_0$, $m_1$ ... $m_k$.

At first the position $m_0$ is scanned. The beam of the laser path measuring system 9 impinges at $m_0$ upon the point $m_0$ which is defined by $x_m + (c_x/2) - a_x - n(c_x/k)$, $y_m - a_y$, where $n = 0, 1, 2 \ldots k$ and $c_x$ = the distance between the point to be measured (in this case $m_0$) and the y-arm of the reticle 31.

Since $n = 0$ (step zero) $x_m + (c/2) - a$. Then the alignment system of the projection lens is oriented relative to $M_0$ (which is not in particular shown in FIG. 2, however, is illustrated again by two dashes) by displacement of the mount 1 in the manner described hereinbefore. The aligned $M_0$ position is measured by the LPM 9 the resulting data are fed into the computer 20 which calculates the correction value $$\Delta y'_n = y - y_m + a_y$$

$$\Delta y_n = \Delta y'_n - s(-(c_x/2) + n(c_x/k)) - v_y$$

where y is the respective actual y-position, $y_m - a_y$ the respective nominal y-position, $s(-(c_x/2) + n(c_x/k))$ is the angular displacement and $v_y$ the displacement of the origin in y-direction. In the same manner the next discrete points $m_1 \ldots m_k$ for the plane 5 are detected so that the real plane of the reflector is known at the end and the $\Delta_y$ correction values indicative of the departure from the ideal plane of the reflector 5 are stored in the computer 20. In analogy to $\Delta_y$ the $\Delta_x$ values are computed. The correction values $\Delta x$ are computed according to $x_m - a_x$, $y_m + (c_y/2) - a_y - n(c_y/k) + \Delta y_{k/2}$ and the resulting correction values are $$\Delta x'_n = x - x_m + a$$

$$\Delta x_n = x'_n + s(-(c_y/2) + n(c_y/k)) - v_x$$

$v_x$ is obtained in analogy to $v_y$ from $v_x = x - x_m + a$. These data are stored in the computer 20. Now the proper processing of wafers according to FIG. 1 can start. A not shown transport means feeds the wafer 3 onto the mount 1 and places the wafer 3 upon the studs 2. When the wafer abuts against the stops 4' via the edge portion 3" and against the stop 4, the transport operation is stopped and the mounting table 1 is moved by the displacement means 17, 18 to position an area of the wafer 3 to be exposed into the projection field of the projection lens 15.

The coordinates of said area are stored in the computer 20, and when moved into the projection field the x and y directions are controlled by the LPM 8 and 10, the computer involving the respective $\Delta x$, $\Delta y$ correction values so that the departures of the reflectors 5 and 6 from an ideal plane are substantially eliminated. In this manner a precision adjustment of the wafer areas to be exposed is achieved.

FIG. 2a shows a block scheme of the control unit 16 and the displacement and measuring components. The computer 20 having not shown inputs for respective input data is connected to first inputs of the comparators 21 and 22, respectively. The computer 20 is connected to control inputs of the switches 23 and 24. The switches 23 and 24, respectively, connect the outputs of the LPM 9 and 10, respectively, or the outputs of the alignment system 25 to second inputs of the comparator 21 and 22, respectively. The outputs of the comparators 21 and 22, respectively, are connected to the inputs of the DM 17 and 18, respectively. Furthermore, the outputs of the Laser path measuring systems 9 and 10, respectively, are connected to the inputs of the computer 20. The operation of the control unit 16 is explained in connection with FIGS. 1 and 2.

FIG. 3 shows a partial section of FIG. 1 in side view. A part of the mount 1 and one of the studs 2, namely 11, is cut so that an internal channel 11' is visible, also a portion of a sub-pressure duct 11". The stud 11 is provided with a spacer cap 12, which is used when, for example, a wafer charge of smaller thickness is delivered by a producer.

In this manner the wafer 3 is still in the projection plane (3) of the projection lens 15 (FIG. 1).

FIGS. 3a and 3b show two further embodiments of seating wafers of different diameter and thickness, respectively. The invention is not restricted to the above embodiments. It is also feasible to provide an array of studs 2 on the mount 3'.

The alignment system in the projection system (15) which serves to align a wafer relative to the projection lens 15 in the projection plane is described in more detail in *Jena Review*, 1982, Copy 2 page 68 ff.

We claim:

1. A wafer mount for mounting a semiconductor wafer for being processed in a photolithographic procedure, comprising
   a prismatic mounting body made of glass-ceramics,
   a projection lens for producing a pattern on said wafer,
      said prismatic mounting body having a substantially horizontal top face in opposition to said projection lens, and two back-supports substantially at right angles to one another provided at two neighboring end portions of said top face,
   said back-supports having each a back face, said wafer being arranged in the projection plane of said projection lens,
   a first laser path measuring system in spaced opposition to one of the back faces,
   a second laser measuring system in spaced opposition to the other of the back faces,
   a first elongated substantially plane reflector being attached to said one back face,
   a second elongated substantially plane reflector being attached to said other back face,
      said first reflector being for reflecting a first laser beam emitted by said first laser path measuring system back to the same,
      said second reflector being for reflecting a second laser beam emitted by said second laser path measuring system back to the same,
      said first and said second laser beams defining a plane substantially coinciding with a surface of said wafer,
   displacement means for displacing said prismatic wafer mount in at least two coordinate directions,
   a control unit,
   means for connecting said control unit to said displacement means,
   means for connecting said control unit to said first and second laser path measuring system,
   means for seating said wafers on said top face,
   means for aligning said wafer relative to said projection lens, the alignment means being incorporated in said projection lens,
   means for connecting said projection lens to said control unit.

2. A wafer mount as claimed in claim 1, wherein said means for seating said wafers are constituted of at least three studs having openings each in their top portion for sucking said wafers, and means for connecting said openings via an internal channel to a subpressure air system.

3. A wafer mount as claimed in claim 2, wherein the studs are provided with spacer caps for varying the heights of said studs.

4. A wafer mount as claimed in claim 3, wherein said spacer caps are provided with a hole each in a top portion.

5. A wafer mount as claimed in claim 1, wherein means are provided for substantially eliminating departures of said first and second reflector from an ideal plane.

6. A wafer mount as claimed in claim 5, wherein the means for substantially eliminating departures from an "ideal" plane is embodied by a wafer normal which serves to detect departures of said first and second reflector from an ideal plane by cooperation of said projection lens, said first and second laser path measuring system and said displacement means under control of said control unit.

7. A wafer mount as claimed in claim 6, wherein said control unit is a computer including a storage.

8. A wafer mount as claimed in claim 7, wherein said computer calculates the departures of said first and second reflector, respectively, from an "ideal" plane from the measuring data obtained from said displacement means and said means for aligning said projection lens relative to said wafer normal and stores the resulting correction values in said storage.

9. A wafer mount as claimed in claim 8, wherein said correction values in said storage are used to control the positioning of wafers to be processed relative to the projection lens.

* * * * *